US006397972B1

(12) United States Patent
Bank et al.

(10) Patent No.: US 6,397,972 B1
(45) Date of Patent: Jun. 4, 2002

(54) LOUDSPEAKERS

(75) Inventors: Graham Bank, Suffolk; Julian Fordham, Cambridgeshire, both of (GB)

(73) Assignee: New Transducers Limited, London (GB)

( * ) Notice: Subject to any disclaimer, the term of this patent is extended or adjusted under 35 U.S.C. 154(b) by 0 days.

(21) Appl. No.: 09/985,781

(22) Filed: Nov. 6, 2001

Related U.S. Application Data

(63) Continuation of application No. PCT/GB00/01666, filed on May 11, 2000.

(30) Foreign Application Priority Data

May 14, 1999 (GB) ............................................ 9911156

(51) Int. Cl.[7] .................................................. H05K 5/00

(52) U.S. Cl. ........................... 181/148; 84/157; 84/171; 381/423; 381/431

(58) Field of Search ................................ 181/157, 171, 181/173, 148; 381/423, 431

(56) References Cited

U.S. PATENT DOCUMENTS 3,720,285 A 3/1973 Russell et al. ............ 181/31 B
5,241,512 A * 8/1993 Argy et al. ................. 181/198
6,247,551 B1 * 6/2001 Heron ......................... 181/170
6,324,052 B1 * 11/2001 Azima et al. ............... 361/681
6,324,294 B1 * 11/2001 Azima et al. ............... 181/287

FOREIGN PATENT DOCUMENTS

| | | |
|---|---|---|
| FR | 2 549 333 | 1/1985 |
| WO | WO 97/09842 | 3/1997 |
| WO | WO 00/07409 | 2/2000 |

* cited by examiner

*Primary Examiner*—Robert E. Nappi
*Assistant Examiner*—Kim Lockett
(74) *Attorney, Agent, or Firm*—Foley & Lardner

(57) ABSTRACT

A loudspeaker comprising a bending wave panel, an enclosure in which the bending wave panel is mounted to enclose one face of the panel, a compliant suspension between the panel and the enclosure by which the panel is supported in the enclosure, a vibration exciter attached to the panel to apply bending wave energy thereto, and an acoustic absorber in the enclosure to reduce standing waves in the enclosure, wherein the compliant suspension and the acoustic absorber are integral. A method of making such a loudspeaker is also disclosed.

9 Claims, 1 Drawing Sheet

Figure 1 – Prior Art.
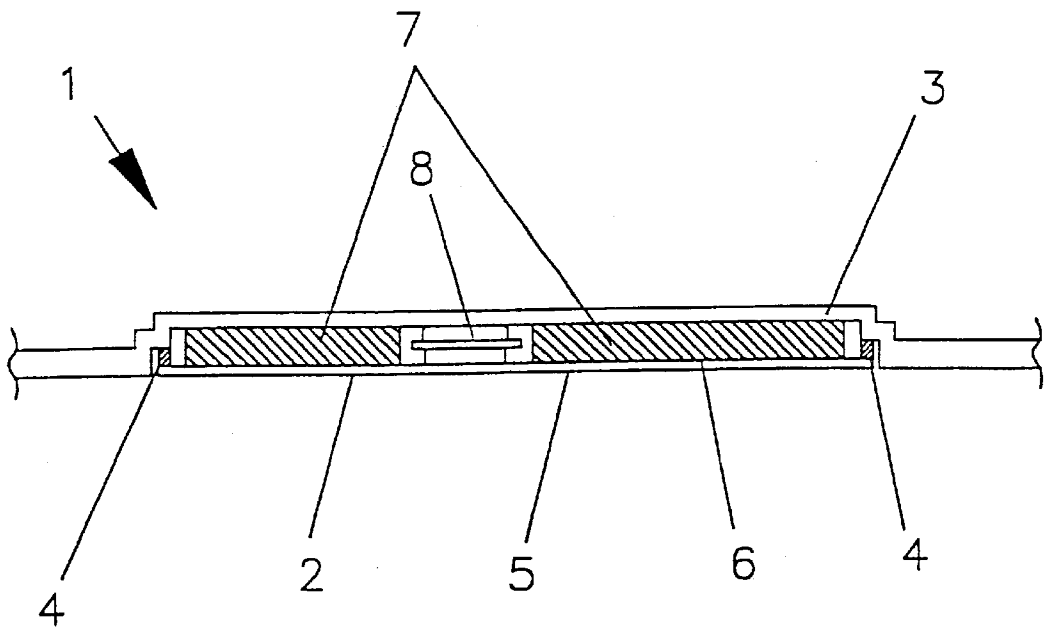
Figure 2
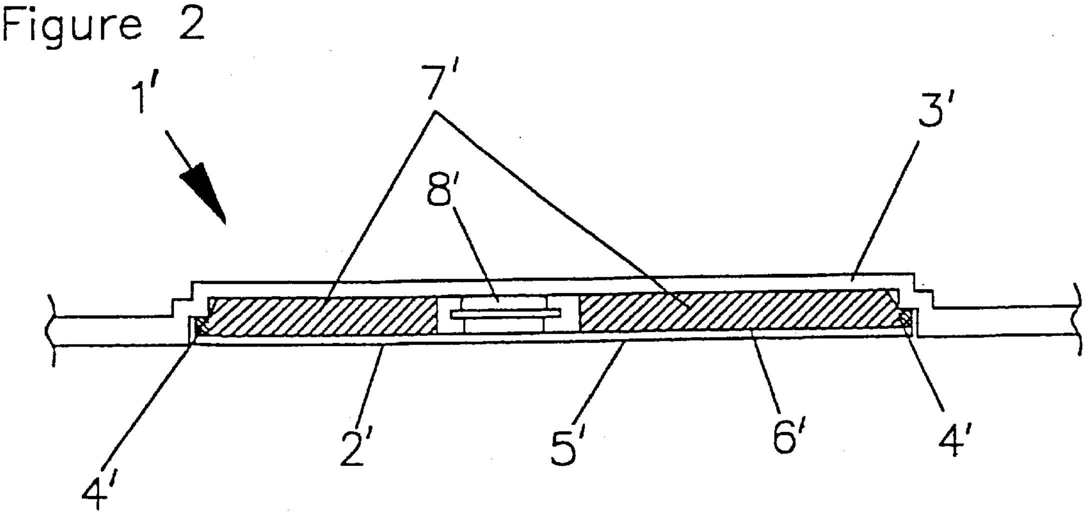

LOUDSPEAKERS

This application is a continuation of International patent application No. PCT/GB00/01666, filed May 11, 2000, and published in English.

TECHNICAL FIELD

The invention relates to loudspeakers and, more particularly, to bending wave panel-form loudspeakers, e.g. of the kind described in International patent application WO97/09842 and U.S. counterpart application Ser. No. 08/707,012, filed Sep. 3, 1996. Such loudspeakers are known as "distributed mode" or "DM" loudspeakers, or simply as DML.

BACKGROUND ART

Bending wave panels emit acoustic radiation from both sides,. i.e. are bi-polar, and to allow easier positioning of the loudspeaker in a room, e.g. against a wall, the rear radiation from the panel can be blocked by mounting the panel in a sealed box or enclosure with flexible suspension or surround material around the panel perimeter. This prevents any destructive interference from reflecting surfaces to the rear of the panel. The panel suspension or surround material may be a strip of flexible foam rubber or plastics with adhesive tape on both sides so that it can be fixed to both the panel and the box.

However, in such an arrangement standing waves may be set up in the box or enclosure which can adversely affect the frequency response of the panel. These standing waves can be damped by filling the box or enclosure with an acoustic absorber, e.g. of soft foam which can contact either the bending wave panel or the back of the box or enclosure. Flexible polyester or polyether foams are suitable for this application. A known setup for a bending wave panel of the DML kind in an enclosure uses a strip of flexible foam as a suspension or surround and uses a separate acoustic absorber in the enclosure.

SUMMARY OF THE INVENTION

According to the present invention, there is provided a loudspeaker comprising a bending wave panel in an enclosure, wherein the panel surround suspension system and the acoustic absorber are integrated. A soft foam used as the acoustic absorber may thus be compressed to the required thickness around the perimeter of the panel to form the flexible surround, whereas the central region of the foam remains uncompressed allowing it to form an effective acoustic absorber. In other words, the density of the foam in the perimeter region is higher than that in the central region.

According to another aspect of the invention, there is provided a method of making a loudspeaker sub-assembly having a bending wave panel, a flexible surround suspension for the panel and an acoustic absorber for filling the space between the panel and an enclosure to which the panel will be mounted via the suspension. The method comprises the steps of applying a layer of adhesive to one face of the panel along the perimeter thereof; placing a piece of uncompressed foam on the one face of the panel so as to cover the one face and contact the adhesive; applying heat and pressure to the panel and the foam along the perimeter thereof to compress the foam and cure the adhesive so as to form a surround suspension that is bonded to the panel and is denser than the acoustic absorber foam bounded by the surround suspension; and removing the heat and pressure from the panel and the foam.

According to yet another aspect of the invention, there is provided a method of making a loudspeaker having a sub-assembly made as above, comprising the further step of assembling the panel, with integral surround suspension and acoustic absorber, to the enclosure.

BRIEF DESCRIPTION OF THE DRAWING

The best mode of carrying out the invention is described in detail below and diagrammatically illustrated in the accompanying drawing, in which:

FIG. 1 is a cross-sectional side view of a prior art bending wave loudspeaker, and FIG. 2 is a cross-sectional side view of a bending-wave loudspeaker according to the invention.

DETAILED DESCRIPTION

In FIG. 1 there is shown a prior art bending wave panel loudspeaker 1, comprising a bending wave panel 2 mounted in an enclosure or box 3 by means of a surround or suspension 4, e.g. of a resilient foamed rubber or plastics. Thus the outer face 5 of the panel 2 can radiate sound while acoustic radiation from the face 6 of the panel in the enclosure 3 is contained in the enclosure and is absorbed by acoustic absorber foam 7. A vibration exciter 8 is fixed to the panel 2 to launch bending wave energy into the panel to cause it to resonate to produce an acoustic output, e.g. as taught in WO97/09842 and U.S. Ser. No. 08/707,012.

In FIG. 2 there is shown a loudspeaker generally similar to that of FIG. 1, but modified according to the principles of the present invention. Like but primed reference numerals are used in FIG. 2. Thus the surround/suspension 4 is integral with the acoustic absorber 7.

A manufacturing process for the unitary absorber/suspension 4, 7 may be as follows:

1. Apply a layer of adhesive (e.g. epoxy, acrylic or cyanoacrylate) around the perimeter of the panel.
2. Cut the piece of uncompressed foam to the required size.
3. Position the foam in one half of the press tool and the panel in the opposite half.
4. Apply heat and pressure suitable for the foam material to compress and the surround adhesive to cure and form an effective bond between panel and surround material.
5. Remove the part from the press tool.
6. The panel surround (including the panel and acoustic absorber) can then, for example, be adhesively bonded or mechanically clamped to the back box to form a complete unit.

Compressing the foam around the perimeter changes it from an open-cell foam suitable as an absorber into a compressed version where the cells are squashed to an extent that the perimeter has very little acoustic power transmitted through it. This ensures isolation of the rear radiation from the front.

The present invention thus provides a new design whereby the foam surround and acoustic absorber are incorporated into a single item which can be easily formed and bonded to the panel in a simple press tool. This new design simplifies the manufacturing process for a DML loudspeaker or the like used in a closed back design.

What is claimed is:

1. A loudspeaker comprising a bending wave panel, an enclosure in which the bending wave panel is mounted to enclose one face of the panel, a compliant suspension between the panel and the enclosure by which the panel is supported in the enclosure, a vibration exciter attached to the panel to apply bending wave energy thereto, and an acoustic absorber in the enclosure to reduce standing waves in the enclosure, wherein the compliant suspension and the acoustic absorber are integral.

2. A loudspeaker according to claim 1, wherein the integral acoustic absorber and compliant suspension are of a soft foam material.

3. A loudspeaker according to claim 2, wherein the soft foam material is compressed in the region defining the compliant suspension as compared to the region defining the acoustic absorber.

4. A loudspeaker according to claim 3, wherein the soft foam material in the region defining the acoustic absorber is substantially uncompressed.

5. A loudspeaker according to claim 1, wherein the density of the compliant suspension is greater than the density of the acoustic absorber.

6. A method of making a loudspeaker sub-assembly having a bending wave panel, a flexible surround suspension for the panel and an acoustic absorber for filling the space between the panel and an enclosure to which the panel will be mounted via the suspension, comprising the steps of:

applying a layer of adhesive to one face of the panel along the perimeter thereof;

placing a piece of uncompressed foam on said one face of the panel so as to cover said one face and contact the adhesive;

applying heat and pressure to the panel and the foam along the perimeter thereof to compress the foam and cure the adhesive so as to form a surround suspension that is bonded to the panel and is denser than the acoustic absorber foam bounded by the surround suspension; and removing the heat and pressure from the panel and the foam.

7. A method of making a loudspeaker having a bending wave panel mounted to an enclosure, a vibration exciter fixed to the panel for launching bending wave energy into the panel, a flexible surround suspension for the panel, and an acoustic absorber for filling the space between the panel and the enclosure, comprising the steps of:

applying a layer of adhesive to one face of the panel along the perimeter thereof;

placing a piece of uncompressed foam on said one face of the panel so as to cover said one face and contact the adhesive;

applying heat and pressure to the panel and the foam along the perimeter thereof to compress the foam and cure the adhesive so as to form a surround suspension that is bonded to the panel and is denser than the acoustic absorber foam bounded by the surround suspension;

removing the heat and pressure from the panel and the foam; and assembling the panel, with integral surround suspension and acoustic absorber, to the enclosure.

8. A method according to claim 7, wherein the step of assembling the panel to the enclosure comprises adhesively bonding the surround suspension to the enclosure.

9. A method according to claim 7, wherein the step of assembling the panel to the enclosure comprises mechanically clamping the panel to the enclosure with the surround suspension between the panel and the enclosure.

* * * * *